US008383489B2

(12) United States Patent
Huang (10) Patent No.: US 8,383,489 B2
(45) Date of Patent: Feb. 26, 2013

(54) SOI WAFER AND METHOD FOR FORMING THE SAME

(75) Inventor: Herb He Huang, Jiangsu Province (CN)

(73) Assignee: Jiangsu Lexvu Electronics Co., Ltd., Jiangsu Province (CN)

( * ) Notice: Subject to any disclaimer, the term of this patent is extended or adjusted under 35 U.S.C. 154(b) by 319 days.

(21) Appl. No.: 12/815,048

(22) Filed: Jun. 14, 2010

(65) Prior Publication Data
US 2011/0037142 A1 Feb. 17, 2011

(30) Foreign Application Priority Data

Aug. 13, 2009 (CN) .......................... 2009 1 0165230

(51) Int. Cl.
*H01L 21/76* (2006.01)
(52) U.S. Cl. ................. 438/424; 438/435; 257/E21.546; 257/E29.02
(58) Field of Classification Search .................. 438/435, 438/424; 257/E21.546, E29.02
See application file for complete search history.

(56) References Cited

U.S. PATENT DOCUMENTS

| | | | | |
|---|---|---|---|---|
| 5,416,041 A | * | 5/1995 | Schwalke | 438/404 |
| 5,426,070 A | * | 6/1995 | Shaw et al. | 216/2 |
| 6,214,696 B1 | * | 4/2001 | Wu | 438/424 |
| 6,232,202 B1 | * | 5/2001 | Hong | 438/424 |

FOREIGN PATENT DOCUMENTS

CN 101207009 A 6/2008

\* cited by examiner

*Primary Examiner* — David S Blum
(74) *Attorney, Agent, or Firm* — Kilpatrick Townsend & Stockton (57) ABSTRACT

An SOI wafer and a method for forming the same, where the method for forming an SOI wafer includes: preparing a monocrystalline silicon wafer on which a mask layer is formed; etching the mask layer and the monocrystalline silicon wafer to form several trenches; forming a first insulating layer on the sidewalls and the bottoms of the trenches; etching and removing the first insulating layer on the bottoms of the trenches; etching along the trenches the monocrystalline silicon wafer beneath the trenches to form cavities; processing the inner walls of the cavities to form a second insulating layer; and filling up the trenches and the cavities with an insulating material layer. The process of the invention is easy to be implemented at a low manufacturing cost and an SOI wafer being formed is of high quality while being capable of being compatible with a standard process of manufacturing a bulk silicon CMOS.

15 Claims, 7 Drawing Sheets

SOI WAFER AND METHOD FOR FORMING THE SAME

CROSS REFERENCE TO RELATED APPLICATIONS

The present application claims priority to 200910165230.2 filed Aug. 13, 2009 entitled "SOI WAFER AND METHOD FOR FORMING THE SAME", incorporated by reference for all purposes.

FIELD OF THE INVENTION

The present invention relates to the field of semiconductor technologies and in particular to an SOI wafer and a method for forming the same.

BACKGROUND OF THE INVENTION

At present, Silicon-On-Insulator (SOI) wafers, which are semiconductor substrates capable of providing semiconductor devices with high performance, have been highly regarded widely. An SOI wafer includes a silicon substrate, an insulating layer and a top silicon layer. Such a structure can be advantageous in that: (1) it can be used to manufacture a large scale integrated circuit with lines of less than 0.1 μm to thereby eliminate various parasitic effects due to manufacturing of such highly integrated devices in bulk silicon; (2) it can be used to manufacture high-speed and low-power-consumption semiconductor devices required for various mini apparatus; (3) it can be used to manufacture a semiconductor device against nuclear radiation; and (4) local isolation of MOS devices can be formed to boost an allowable operating voltage of the isolated devices. Therefore, the SOI material has been commonly recognized in the industry as a basic material for the future predominant industry of large scale integrated circuits.

Figure 1:
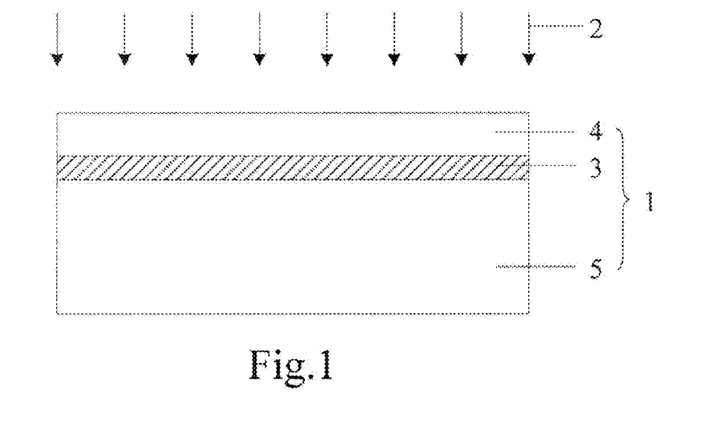
FIG. 1 illustrates a schematic diagram of forming an SOI wafer in the method of Separation by Implanted Oxygen in the prior art.

There are three existing methods for manufacturing an SOI material, the first of which is referred to as Separation by Implanted Oxygen, which is the main method currently adopted for manufacturing the SOI material. As illustrated in FIG. 1, this method generally includes preparing a monocrystalline silicon wafer 1, implanting oxygen ions 2 into the monocrystalline silicon wafer and forming an insulating layer 3 in the monocrystalline silicon wafer 1 through annealing at a high temperature. Such an insulating layer separates the original monocrystalline silicon wafer 1 into two parts, i.e., a top silicon layer 4 and a silicon substrate 5.

Figure 2:
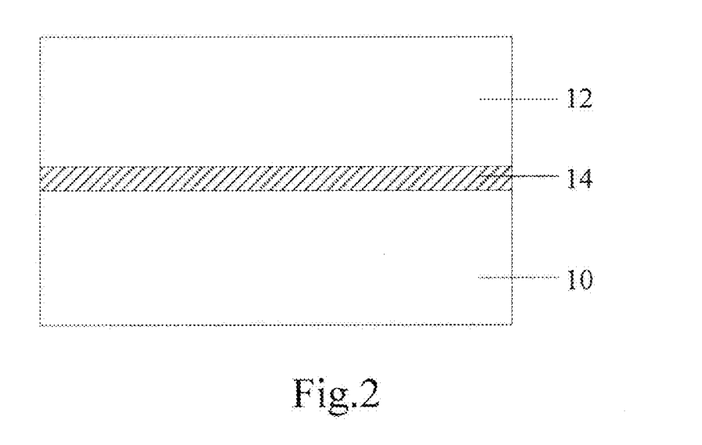
FIG. 2 to FIG. 3 illustrate schematic diagrams of forming an SOI wafer in the method of "Bonding SOI" in the prior art.
Figure 3:
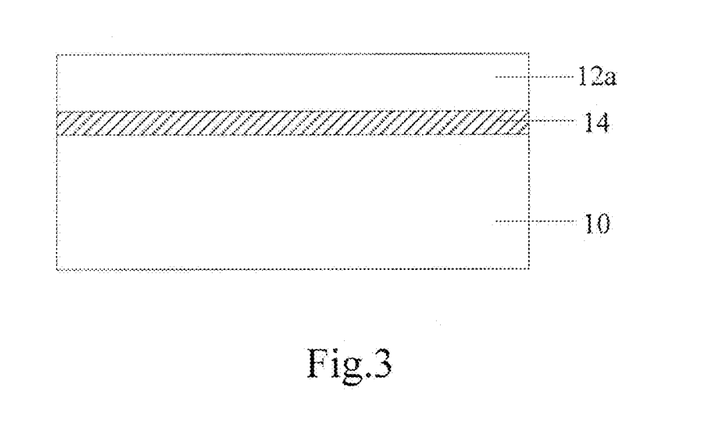

The second method is referred to as "Bonding SOI", which forms an SOI wafer of excellent quality. In this method as illustrated in FIG. 2, the surfaces of a first monocrystalline silicon wafer 10 and of a second monocrystalline silicon wafer 12 are bonded tightly to each other, wherein, an insulating layer 14 formed through oxidization, etc., on the surface of the first monocrystalline silicon wafer 11 or the second monocrystalline silicon wafer 12 is annealed to enhance adhesion at the bonding interface, and referring to FIG. 3, thereafter the non-bonded side of the second monocrystalline silicon wafer 12 is polished or etched to leave a relatively thin top silicon layer 12a on the insulating layer 14. The most important point in this method lies in the step of thinning the substrate.

Figure 4:
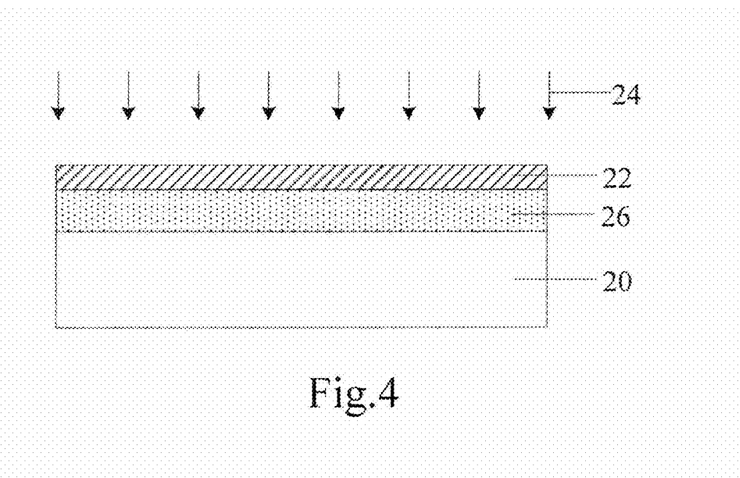
FIG. 4 to FIG. 6 illustrate schematic diagrams of forming an SOI wafer in the method of "Smart Cut" in the prior art.
Figure 5:
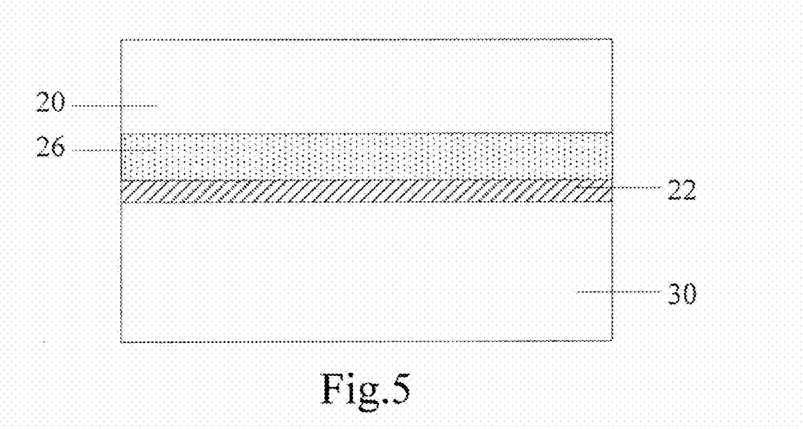
Figure 6:
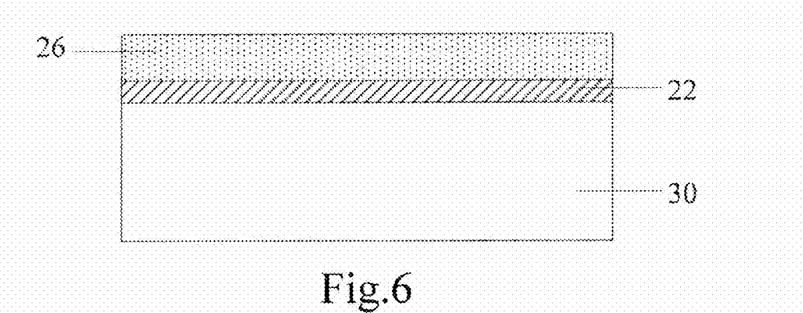

The third method is referred to as "Smart Cut", as mentioned in the solution disclosed in Chinese Patent Application No. 200710161139. As illustrated in FIG. 4, a first monocrystalline silicon wafer 20 is prepared; and an insulating layer 22 is formed on the bonded side of the first monocrystalline silicon wafer 20 through thermal oxidation, etc. Hydrogen ions 24 are implanted into the first monocrystalline silicon wafer 20 through the insulating layer 22 to form a uniform ion implanted layer 26. After ion implantation, the first monocrystalline silicon wafer 20 is subject to a thermal process, which is a process prior to a stripping process for reducing in advance the mechanical strength of the "implantation interface" of the ion implanted layer 26 and also for preventing a roughness increase of the surface of an SOI film resulting from stripping the "implantation interface" in the subsequent process. As illustrated in FIG. 5, after the surfaces of the first monocrystalline silicon wafer 20 and a second monocrystalline silicon wafer 30 are subject to a cleaning process, the first monocrystalline silicon wafer 20 and a second monocrystalline silicon wafer 30 are bonded tightly; and then a thermal process is performed to enhance the bonding strength of the insulating layer 22 of the first monocrystalline silicon wafer 20 with first the monocrystalline silicon wafer. Referring to FIG. 6, the silicon substrate on the ion implanted layer 26 of the first monocrystalline silicon wafer 20 is stripped mechanically from the first monocrystalline silicon wafer 20 to form an SIO wafer.

The existing three methods for forming an SOI wafer suffer from respective drawbacks. In the method of Separation by Implanted Oxygen, crystal lattices of the monocrystalline silicon wafer may be destroyed after oxygen gas implantation and annealing processes to thereby reduce greatly the insulating performance of the insulating layer and further reduce the quality of the SOI material.

In the method of "Bonding SOI", the silicon substrate with a thickness up to approximately several hundreds of micrometers has to be polished or etched uniformly to several micrometers or even one micrometer or less, which may be technically of extremely difficulty in terms of controllability and uniformity and at a extremely high cost. Moreover, gaps may occur at the bonding interface during bonding for formation of an SOI wafer, for example, due to contamination on the bonding surface or unevenness of the bonding surface with poor evenness, to thereby influence the quality of the SOI wafer.

The method of "Smart Cut" demands for high precision of the process, which may be difficult and expensive to be implemented.

SUMMARY OF THE INVENTION

An problem solved by the invention is to provide an SOI wafer and a method for forming the same so as to avoid poor insulating performance of an insulating layer and poor quality of the SOI wafer as well as a high manufacture cost.

To address the above problem, an embodiment of the invention provides a method for forming an SO wafer, which includes: preparing a monocrystalline silicon wafer on which a mask layer is formed; etching the mask layer and the monocrystalline silicon wafer to form several trenches; forming a first insulating layer on the sidewalls and the bottoms of the trenches; etching and removing the first insulating layer on the bottoms of the trenches; etching along the trenches the monocrystalline silicon wafer beneath the trenches to form cavities; processing the inner walls of the cavities to form a second insulating layer; and tilling up the trenches and the cavities with an insulating material layer.

Optionally, the mask layer includes a first film layer and a second film layer on the first film layer.

Optionally, the first film layer is made of silicon oxide, and the second film layer is made of silicon nitride.

Optionally, the first insulating layer is formed through thermal oxidization, thermal nitrification or chemical vapor deposition.

Optionally, the first insulating layer is made of silicon oxide or silicon nitride with a thickness of 1 nm to 10 μm.

Optionally, the first insulating layer on the bottoms is etched and removed through plasma etching or ion beam etching using Gas of Argon.

Optionally, the monocrystalline silicon wafer is etched through dry etching using gas of $XeF_2$ or mixed gas of $HNO_3$ and HF.

Optionally, the second insulating layer is formed through thermal oxidation or thermal nitrification.

Optionally, the second insulating layer is made of silicon oxide or silicon nitride.

Optionally, the insulating material layer is filled through low-pressure chemical vapor disposition or spin coating.

Optionally, the insulating material layer is made of silicon oxide or silicon oxide containing phosphor, boron, carbon, nitrogen or hydrogen.

An SOI wafer includes: a monocrystalline silicon wafer; trenches arranged in the monocrystalline silicon wafer; cavities arranged in the monocrystalline silicon wafer and interconnected with the trenches; a first insulating layer arranged on the sidewalls of the trenches; a second insulating layer arranged on the inner walls of the cavities; and an insulating material layer filling up the trenches and the cavities.

Optionally, the first insulating layer is made of silicon oxide or nitride silicon with a thickness of 1 nm to 10 μm.

Optionally, the second insulating layer is made of silicon oxide or nitride silicon.

Optionally, the insulating material layer is made of silicon oxide or silicon oxide containing phosphor, boron, carbon, nitrogen or hydrogen.

The invention offers the following advantages over the prior art: the trenches and the cavities are formed in the monocrystalline silicon wafer, and then the insulating layers and the insulating material layer are formed in the trenches and the cavities as an insulating layer of an SIO wafer, where the insulating material layer in the cavities separates the monocrystalline silicon wafer into a silicon substrate and a top layer silicon. In this process, insulating silicon oxide is formed through deposition or spin coating to thereby address the problem in the method of Separation by Implanted Oxygen that crystal lattices of the monocrystalline silicon wafer may be destroyed due to the oxygen gas implantation and annealing processes to degrade the insulating performance of the insulating layer, also to obviate the problem in the method of "Bonding SOI" that gaps may occur at the bonding interface due to contamination on the bonding surface or unevenness of the bonding surface with poor evenness, and further achieve easiness of the process, a low manufacturing cost and the resulting SOI wafer of high quality as compared with the method of "Smart Cut" while being capable of being compatible with a standard process of manufacturing a bulk silicon CMOS.

DETAILED DESCRIPTION OF THE INVENTION

The existing several method for forming an SOT wafer may destroy crystal lattices of a monocrystalline silicon wafer to thereby degrade the insulating performance of the SOI wafer or suffer from complex processes, a high manufacturing cost and degrading of the quality of the resulting SOI wafer. According to embodiments of the invention, trenches and cavities are formed in a monocrystalline silicon wafer, and then insulating layers and an insulating material layer are formed in the trenches and the cavities as an insulating layer of an SIO wafer, where the insulating material layer in the cavities separates the monocrystalline silicon wafer into a silicon substrate and a top layer silicon. In this process, insulating silicon oxide is formed through deposition or spin coating to thereby address the problem in the method of Separation by Implanted Oxygen that crystal lattices of the monocrystalline silicon wafer may be destroyed due to the oxygen gas implantation and annealing processes to degrade the insulating performance of the insulating layer, also obviate the problem in the method of "Bonding SOI" that gaps may occur at the bonding interface due to contamination on the bonding surface(s) or unevenness of the bonding surface(s) with poor flatness, and further achieve easiness of the procedure, a low manufacturing cost and the resulting SOT wafer of high quality as compared with the method of "Smart Cut".

Figure 14:
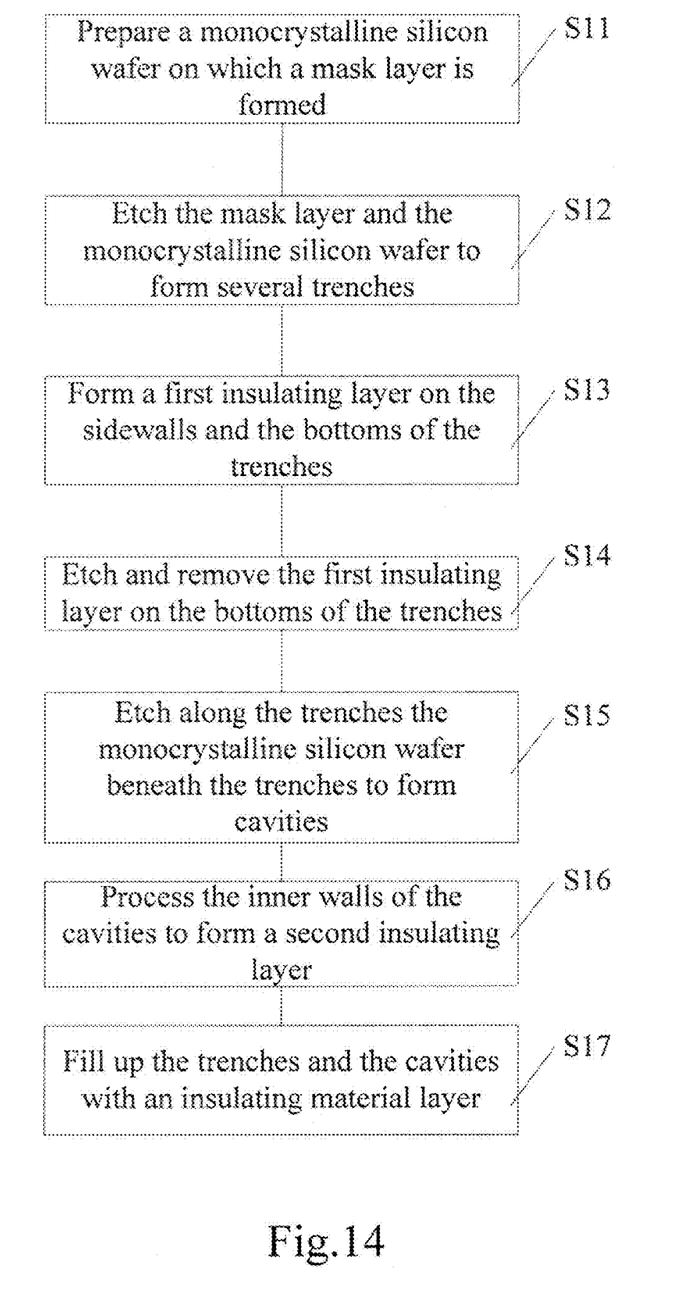
FIG. 14 illustrates a flow chart of an embodiment of forming an SOI wafer according to the invention.

FIG. 14 illustrates a flow chart of an embodiment of forming an SOI wafer according to the invention. As illustrated in FIG. 14, the step S11 is performed to prepare a monocrystalline silicon wafer on which a mask layer is formed; the step S12 is performed to etch the mask layer and the monocrystalline silicon wafer to form several trenches; the step S13 is performed to form a first insulating layer on the sidewalls and the bottoms of the trenches; the step S14 is performed to etch and thus remove the first insulating layer on the bottoms of the trenches; the step S15 is performed to etch along the trenches the monocrystalline silicon wafer beneath the trenches to form cavities; the step S16 is performed to process the inner walls of the cavities to form a second insulating layer; and the step S17 is performed to fill up the trenches and the cavities with an insulating material layer.

The SOI wafer formed based upon the above embodiment includes: the monocrystalline silicon wafer; the trenches arranged in the monocrystalline silicon wafer; the cavities arranged in the monocrystalline silicon wafer and interconnected with the trenches; the first insulating layer arranged on the sidewalls of the trenches; the second insulating layer arranged on the inner walls of the cavities; and the insulating material layer filling up the trenches and the cavities.

An embodiment of the invention will be detailed below with reference to the drawings.

Figure 7:
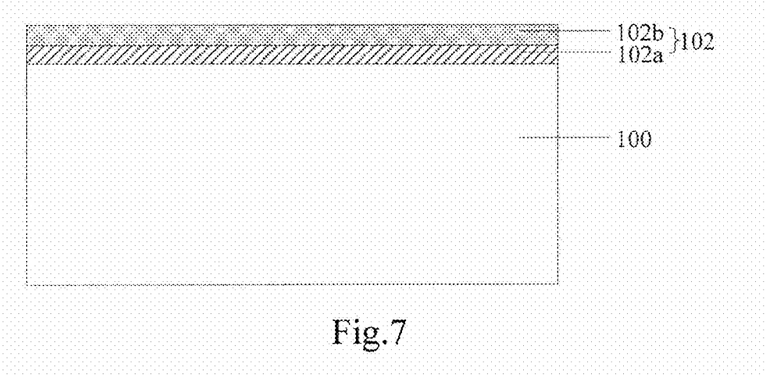
FIG. 7, FIG. 8, FIG. 9 FIG. 10, FIG. 11a, FIG. 11b, FIG. 12a, FIG. 12b, FIG. 13a and FIG. 13b illustrate schematic diagrams of an embodiment of a process for forming an SOI wafer according to the invention.

FIG. 7, FIG. 8, FIG. 9, FIG. 10, FIG. 11a, FIG. 11b, FIG. 12a, FIG. 12b, FIG. 13a and FIG. 13b illustrate schematic diagrams of the embodiment of a process for forming an SOI wafer according to the invention. As illustrated in FIG. 7, a monocrystalline silicon wafer 100 with a thickness of 500 μm to 1500 μm is prepared; a first film layer 102a made of silicon oxide with a thickness of 1 nm to 1 μm is formed on the monocrystalline silicon wafer 100 through thermal oxidization; and a second film layer 102b made of Silicon Nitride with a thickness of 1 nm to 1 μm is formed on the first film layer 102a through chemical vapor disposition, where the first film layer 102a and the second film layer 102b constitute a mask layer 102 which functions to prevent the monocrystalline silicon wafer 100 from being damaged during subsequent etching and grinding.

Figure 8:
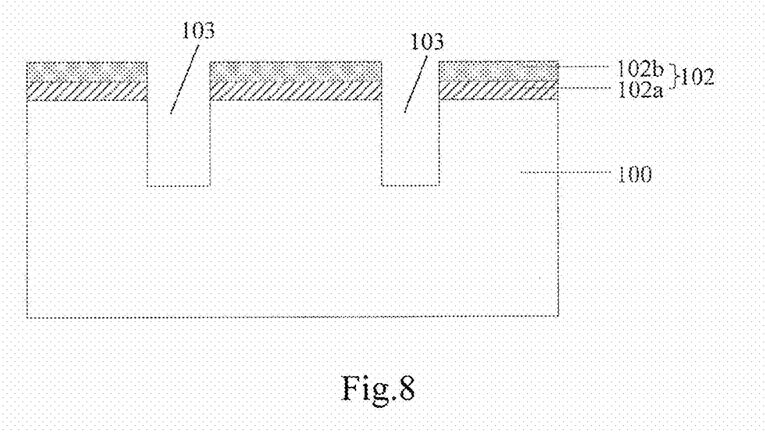

Referring to FIG. 8, several trenches 103 are formed in the monocrystalline silicon wafer 100. A specific formation process is as follows: a photoresist layer (not illustrated) is formed on the mask layer 102 through spin coating and is exposed and developed to define several trench photoresist patterns on the photoresist layer; the mask layer 102 is etched along the trench photoresist patterns using the photoresist layer as a mask to form trench patterns; and the photoresist layer is removed and then the monocrystalline silicon wafer 100 is etched along the trench patterns using the mask layer 102 as a mask to form the trenches 103.

In this embodiment, the trenches 103 have a width of 10 nm to 50 μm, a depth of 50 nm to 50 μm and the number of the trenches 103 is dependent upon whether the cavities to be formed subsequently beneath the trenches 103 can be interconnected to separate the monocrystalline silicon wafer 100 into a silicon substrate and a top layer silicon.

Figure 9:
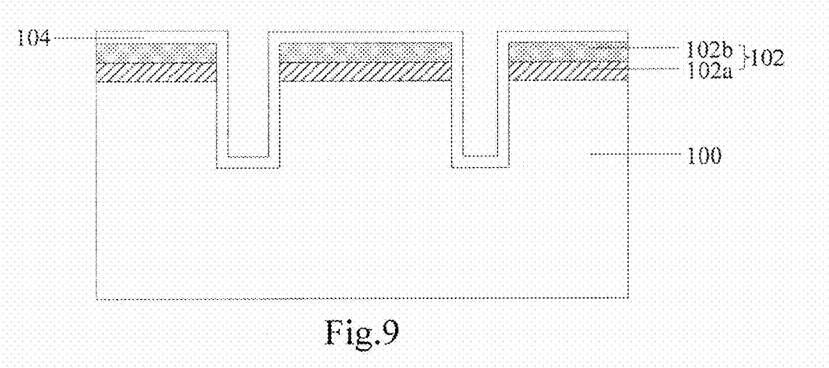

As illustrated in FIG. 9, a first insulating layer 104 with a thickness of 1 nm to 10 μm is formed on the mask layer 102 and the sidewalls of the trenches and the first insulating layer 104 is made of silicon oxide or silicon nitride for the purpose of isolation to prevent any material to be filled subsequently into the trenches from being diffused into the monocrystalline silicon wafer 100, where if the first insulating layer 104 is made of silicon oxide, it can be formed through thermal oxidation, and if the first insulating layer 104 is made of silicon nitride, it can be formed through thermal nitrification or chemical vapor deposition.

Figure 10:
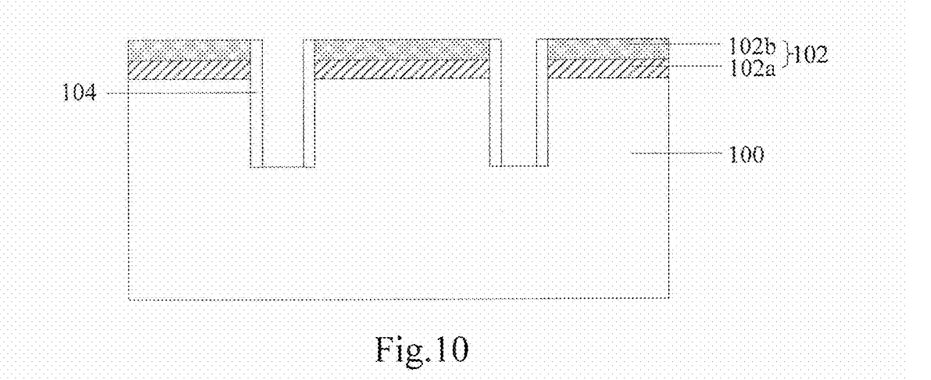

Referring to FIG. 10, the first insulating layer 104 on the mask layer 102 and the bottoms of the trenches is removed through dry etching using Gas of Argon.

Figure 11A:
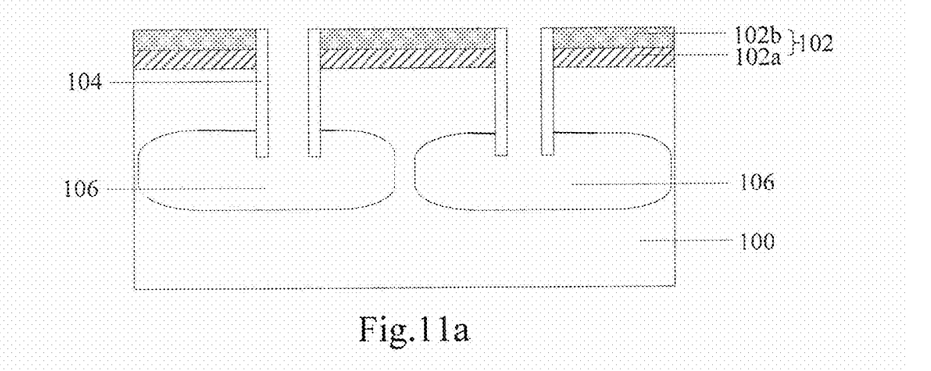
Figure 11B:
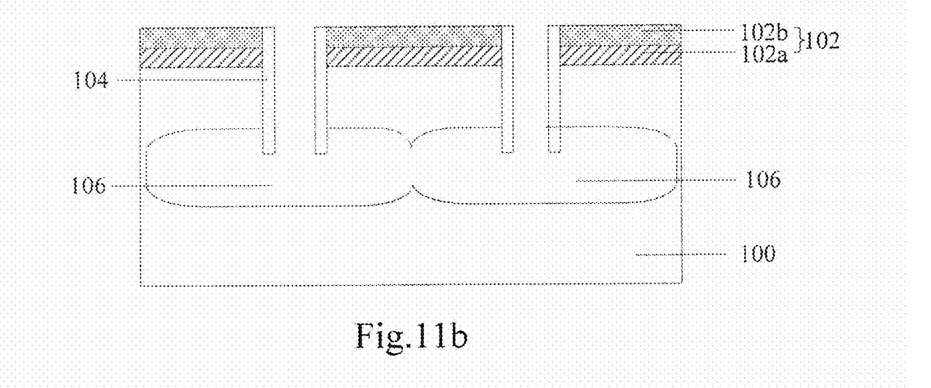

As illustrated in FIG. 11a and FIG. 11b, isotropic etching is performed along the trenches on the monocrystalline silicon wafer 100 beneath the trenches through wet etching using a solution of $XeF_2$ or a mixed solution of $HNO_3$ and HF to form cavities.

In this embodiment, the cavities 106 have a depth of 50 nm to 50 μm.

If one cavity 106 were sufficient to separate the monocrystalline silicon wafer 100, then it would be sufficient to form one trench in the monocrystalline silicon wafer 100.

However the monocrystalline silicon wafer 100 typically has a relatively large area, and more than one trench has to be formed as restricted in the process, so that isotropic etching is performed on the monocrystalline silicon wafer 100 to thereby form the cavities 106 separating the monocrystalline silicon wafer 100. Therefore there are relatively large number of trenches formed in the monocrystalline silicon wafer 100, and after isotropic etching, FIG. 11a illustrates a case where the cavities 106 are spaced at an interval of approximately 10 nm to 1000 nm, and FIG. 11b illustrates another case where the cavities 106 are interconnected completely.

Figure 12A:
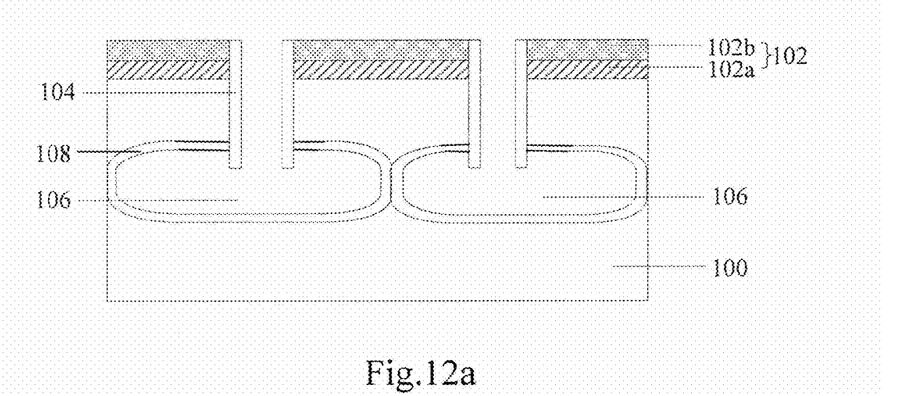
Figure 12B:
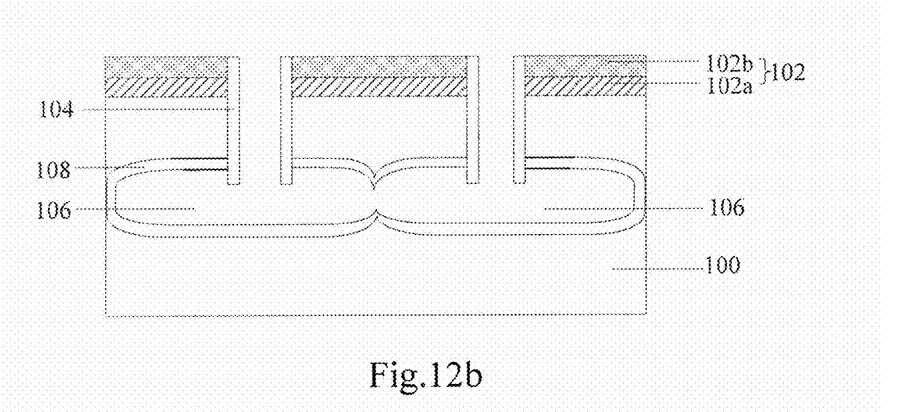

Referring to FIG. 12a and FIG. 12b, the inner walls of the cavities 106 are processed to form a second insulating layer 108 with a thickness of 10 nm to 1000 nm, where the second insulating layer 108 is made of silicon oxide or silicon nitride for the purpose of isolation to prevent any material to be filled subsequently into the cavities from being diffused into the monocrystalline silicon wafer 100, where if the second insulating layer 108 is made of silicon oxide, it can be formed through thermal oxidation, and if the second insulating layer 108 is made of silicon nitride, it can be formed through thermal nitrification.

Referring to FIG. 12a again, the cavities 106 are spaced at an interval during formation thereof and are interconnected through oxidization of the inner walls thereof to thereby separate the monocrystalline silicon wafer 100.

Referring to FIG. 12b, the cavities 106 have been interconnected completely during formation thereof in this case to thereby separate the monocrystalline silicon wafer 100. Therefore, it is sufficient for the purpose of isolation to form the second insulating layer 108 on the inner walls of the cavities 106.

Figure 13A:
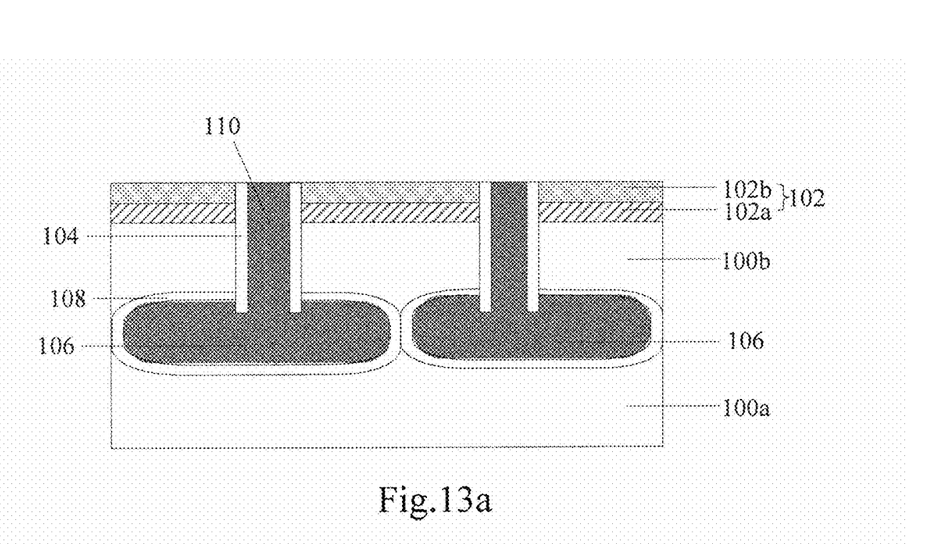
Figure 13B:
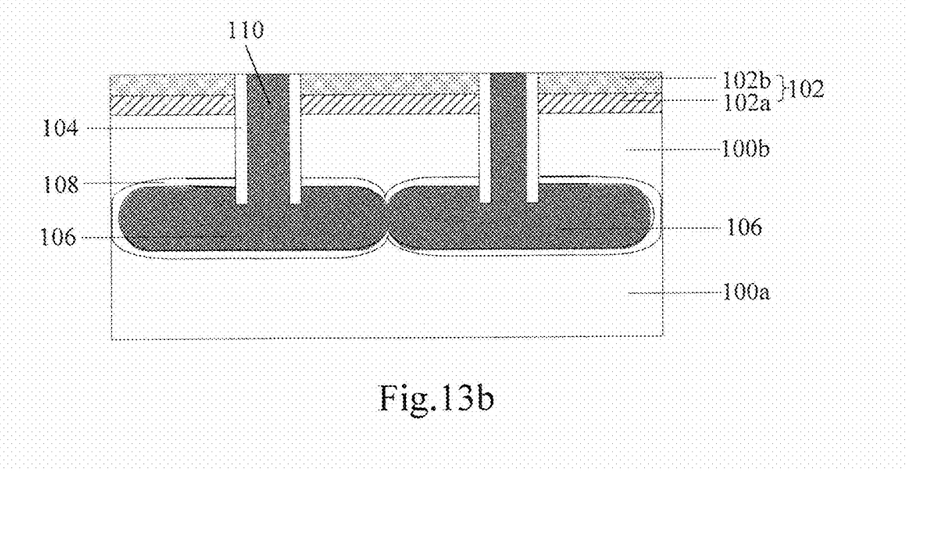

As illustrated in FIG. 13a and FIG. 13b, the trenches and the cavities 106 are filled up with an insulating material layer 110. A specified process is as follows: the insulating material layer 110 is formed on the monocrystalline silicon wafer 100 through low-pressure chemical vapor disposition; the trenches and the cavities 106 are filled up with the insulating material layer 110; and the insulating material layer 110 is planarized through chemical mechanical polishing until the mask layer 102 is exposed.

In this embodiment, the insulating material layer 110 is made of Tetraethyl Orthosilicate, Polysilicon, Silicon Glass, etc.

The first insulating layer 104, the second insulating layer 108 and the insulating material layer 110 constitute the insulating layer of the SOI wafer and separate the monocrystalline silicon wafer into the silicon substrate 100b and the top layer silicon 100a.

The SOI wafer formed based upon the above embodiment includes: the monocrystalline silicon wafer 100; the trenches 103 with a depth of 50 nm to 50 μm arranged in the monocrystalline silicon wafer 100; the cavities 106 with a depth of 50 nm to 50 μm arranged in the monocrystalline silicon wafer 100 and interconnected with the trenches 103; the first insulating layer 104 arranged on the sidewalls of the trenches 103; the second insulating layer 108 arranged on the inner walls of the cavities 106, each of the cavities 106 being interconnected directly or through the second insulating layer 108; and the insulating material layer 110 filling up the trenches 103 and the cavities 106.

Particularly, the first insulating layer 104 and the second insulating layer 108 function to prevent the insulating material layer 110 filled into the trenches 103 and the cavities 106 from being diffused into the monocrystalline silicon wafer 100.

Particularly, the first insulating layer 104, the second insulating layer 108 and the insulating material layer 110 separate the monocrystalline silicon wafer into the silicon substrate 100b and the top layer silicon 100a.

Although the invention has been disclosed as above in connection with the preferred embodiments thereof, the scope of the invention will not be limited thereto, and any skilled in the art can make various variations and modifications without departing from the spirit and scope of the invention. Accordingly, the protection scope of the invention shall be as defined in the appended claims.

What is claimed is:
1. A method for forming an SOI wafer, comprising:
preparing a monocrystalline silicon wafer on which a mask layer is formed;
etching the mask layer and the monocrystalline silicon wafer to form several trenches;
forming a first insulating layer on the sidewalls and the bottoms of the trenches;

etching and removing the first insulating layer on the bottoms of the trenches;

etching along the trenches the monocrystalline silicon wafer beneath the trenches to form cavities;

processing the inner walls of the cavities to form a second insulating layer, the second insulating layers in adjacent cavities connecting with each other to split the monocrystalline silicon wafer into an upper sector of a top layer silicon and a lower sector of a silicon substrate; and filling up the trenches and the cavities with an insulating material layer.

2. The method for forming an SOI wafer according to claim 1, wherein the mask layer comprises a first film layer and a second film layer on the first film layer.

3. The method for forming an SOI wafer according to claim 2, wherein the first film layer is made of silicon oxide, and the second film layer is made of silicon nitride.

4. The method for forming an SOI wafer according to claim 1, wherein the first insulating layer is formed through thermal oxidization, thermal nitrification or chemical vapor deposition.

5. The method for forming an SOI wafer according to claim 4, wherein the first insulating layer is made of silicon oxide or silicon nitride with a thickness of 1 nm to 10 μm.

6. The method for forming an SOI wafer according to claim 1, wherein the first insulating layer on the bottoms is etched and removed through plasma etching or ion beam etching using Gas of Argon.

7. The method for forming an SOI wafer according to claim 1, wherein the monocrystalline silicon wafer is etched through dry etching using gas of XeF2 or mixed gas of HNO3 and HF.

8. The method for forming an SOI wafer according to claim 1, wherein the second insulating layer is formed through thermal oxidation or thermal nitrification.

9. The method for forming an SOI wafer according to claim 8, wherein the second insulating layer is made of silicon oxide or silicon nitride.

10. The method for forming an SOI wafer according to claim 1, wherein the insulating material layer is filled through low-pressure chemical vapor disposition or spin coating.

11. The method for forming an SOI wafer according to claim 10, wherein the insulating material layer is made of silicon oxide or silicon oxide containing phosphor, boron, carbon, nitrogen or hydrogen.

12. The method for forming an SOI wafer according to claim 1, wherein the number of the trenches is dependent upon whether the cavities to be formed subsequently beneath the trenches can be interconnected to separate the monocrystalline silicon wafer into a silicon substrate and a top layer of silicon.

13. The method for forming an SOI wafer according to claim 1, wherein the cavities are spaced at an interval of approximately 10 nm to 1000 nm, and the monocrystalline silicon at the interval is processed to form a part of the second insulating layer in the following processing step.

14. The method for forming an SOI wafer according to claim 1, wherein the adjacent cavities are interconnected with each other completely.

15. The method for forming an SOI wafer according to claim 1, wherein the cavities having a depth of 50 nm to 50 um arranged in the monocrystialline silicon wafer.

* * * * *